United States Patent [19]
Lyu et al.

[11] Patent Number: 5,589,970
[45] Date of Patent: Dec. 31, 1996

[54] LOCKING APPARATUS FOR OPTICAL FREQUENCY MULTIPLEX SYSTEM

[75] Inventors: Gap Y. Lyu; Chang S. Park, both of Daejeon, Rep. of Korea

[73] Assignees: Electronics and Telecommunications Research Institute; Telecommunication Authority, both of Rep. of Korea

[21] Appl. No.: 422,055

[22] Filed: Apr. 14, 1995

[30] Foreign Application Priority Data

Dec. 2, 1994 [KR] Rep. of Korea ............ 1994-32595

[51] Int. Cl.$^6$ ............ H04B 10/00; H04J 14/02
[52] U.S. Cl. ............ 359/133; 359/110; 359/161
[58] Field of Search ............ 359/133, 161, 359/162, 166, 187, 110

[56] References Cited

U.S. PATENT DOCUMENTS 4,989,201 1/1991 Glance ............ 359/187

Primary Examiner—Leo Boudreau
Assistant Examiner—Kinfe-Michael Negash
Attorney, Agent, or Firm— Merchant, Gould, Smith, Edell, Welter & Schmidt

[57] ABSTRACT

A locking apparatus for an optical frequency multiplex system, including a local oscillating unit for applying low frequency signals to individual light sources and thereby making center frequencies of the light sources dither, photocouplers for grouping dithering optical signals outputted from the light sources into a single signal, a resonator for aligning the signals coupled by the photocouplers with optical frequency slots, respectively, a photodetector for converting a reflection optical signal from the photocouplers into a current signal, and an optical frequency stabilizing controller for controlling the light sources on the basis of an error signal detected by the photodetector, whereby the error signal is extracted using the reflection output rather than the transmitting output of the resonator, thereby being capable of enhancing the extinction ratio and maximizing the number of multiplexing light sources.

8 Claims, 3 Drawing Sheets

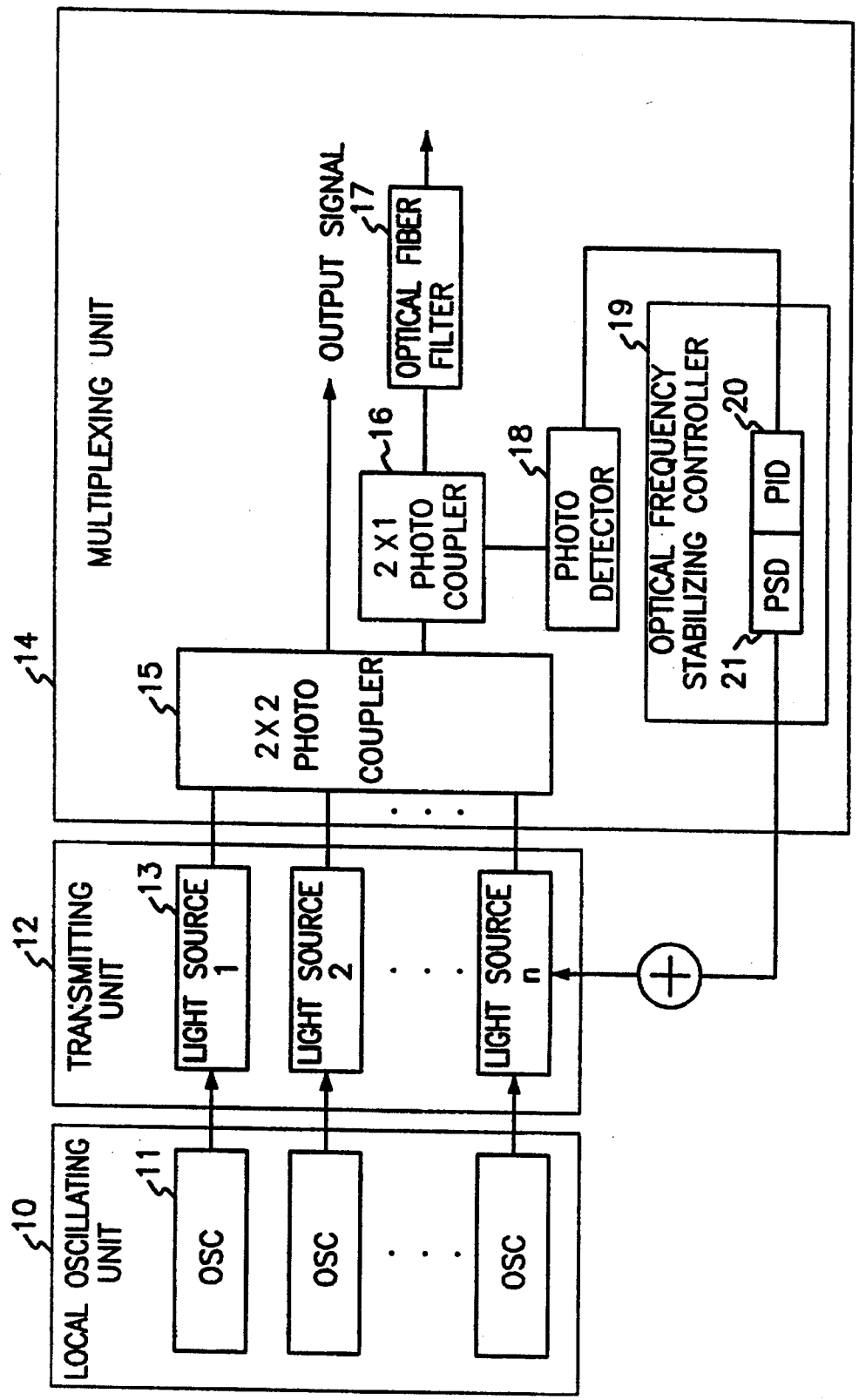

LOCKING APPARATUS FOR OPTICAL FREQUENCY MULTIPLEX SYSTEM

BACKGROUND OF THE INVENTION

1. Field of the Invention

The present invention relates to a locking apparatus for an optical frequency multiplex system, and more particularly to a locking apparatus for an optical frequency multiplex system capable of applying low frequency dithering signals to individual light sources, detecting an error signal for locking at the minimum value point of reflection outputs of an optical fiber filter used as a resonator, thereby enabling a reduction in the number of error signals per channel and accommodating of an increased number of channels.

2. Description of the Prior Art

Generally, an optical multiplexor is a device for optically transferring, through a single optical fiber, several basic transfer signals grouped together The amount of information being transferred is determined by the product of the transfer rate of the basic transfer signals multiplied by the number of groupable signals, namely, the number of channels.

However, a recent progressive increase in demand for broad-band services such as multimedia has resulted in excess information to be transferred over the usable transfer capacity in essential transfer sections. As a result, there is a demand for a new multiplex system, such as an optical frequency multiplex system.

The optical frequency multiplex system is a system constructed, in a transmitting side thereof, to receive modulated optical signals respectively outputted from several light sources; align the received optical signals respectively with predetermined optical frequency slots; group the aligned signals; and then transmit the grouped signals. A receiving side of the system separates and extracts respective optical signals aligned in the frequency slots by the use of optical filters to reproduce the signals.

A commonly used method for such an optical frequency multiplex system for transferring a large amount of information is to maximize the transfer rate per channel within a limited range allowed by currently existing techniques, and then increasing the number of multiplex channels, as compared to subscriber channels. However, such an optical frequency multiplex system is dependent on the system used for generating the frequency slots required for the multiplex system.

In order to solve the above-mentioned problem, there has recently been proposed the use of an optical fiber filter as a resonator and the use of resonance frequencies as slots for the multiplex system.

Referring to FIG. 1, there is illustrated a conventional locking apparatus for an optical frequency multiplex system. As shown in FIG. 1, the locking apparatus includes a transmitting unit 1 comprised of a plurality of light sources 2. Light emitted by the light sources 2 is coupled together by a photocoupler 4. The coupled light outputted from the photocoupler 4 is then sent to an optical fiber filter 5 which is used as a resonator. The light is transmitted through successive resonance frequency components of the optical fiber filter 5. The optical output from the optical fiber filter 5 has a maximum level when the light propagating in the optical fiber filter 5 corresponds to the resonance frequency of the optical fiber filter 5. When the light transmitting the optical fiber filter 5 does not correspond to the resonance frequency of the optical fiber filter 5, the level of the optical output from the optical fiber filter 5 is decreased. Accordingly, the center frequency (or center carrier) is adjusted using an optical frequency stabilizing controller 7 so as to always obtain the maximum optical output detected by a photodetector 6. By this adjustment, optical frequencies of individual light sources 2 correspond to successive resonance frequencies of the optical fiber filter 5, respectively.

When multichannel frequencies are stabilized using the transmitted light beams, however, the intensity of the transmitted light is increased according to the number of multiplexing channels. As a result, the photodetector receiving the multiplexed transmitting light may be saturated when it receives more than a certain amount of transmitted light. In such a case, the signal discriminating ability of the photodetector may be degraded. As a result, it is impossible to obtain any feedback signal.

SUMMARY OF THE INVENTION

Therefore, an object of the invention is to solve the above-mentioned problem encountered in the prior art and, thus, to provide a locking apparatus for an optical frequency multiplex system capable of making center frequencies of light sources dither by applying a low frequency signal to the light sources, aligning the dithering center frequencies of individual light sources with resonance frequencies of an optical fiber filter, receiving a reflection output at each resonance point by a photodetector, analyzing a variation in dithering at each resonance point, and using the result of the analysis as a feedback signal, thereby enabling an optical frequency multiplex system to accomodate a plurality of channels.

In accordance with the present invention, this object can be accomplished by providing a locking apparatus for an optical frequency multiplex system, comprising: local oscillating means adapted to apply low frequency signals to individual light sources and thereby make center frequencies of the light sources dither; photocoupler means adapted to group dithering optical signals outputted from the light sources into a single signal; resonating means adapted to align the signals coupled by the photocoupler means with optical frequency slots, respectively; photodetecting means adapted to convert a reflection optical signal from the photocoupler means into a current signal; and optical frequency stabilizing control means adapted to control the light sources on the basis of an error signal detected by the photodetecting means.

BRIEF DESCRIPTION OF THE DRAWINGS

Other objects and aspects of the invention will become apparent from the following description of embodiments with reference to the accompanying drawings in which:

FIG. 2 is a block diagram of a locking apparatus for an optical frequency multiplex system in accordance with the present invention.

DETAILED DESCRIPTION OF THE PREFERRED EMBODIMENTS

Figure 1:
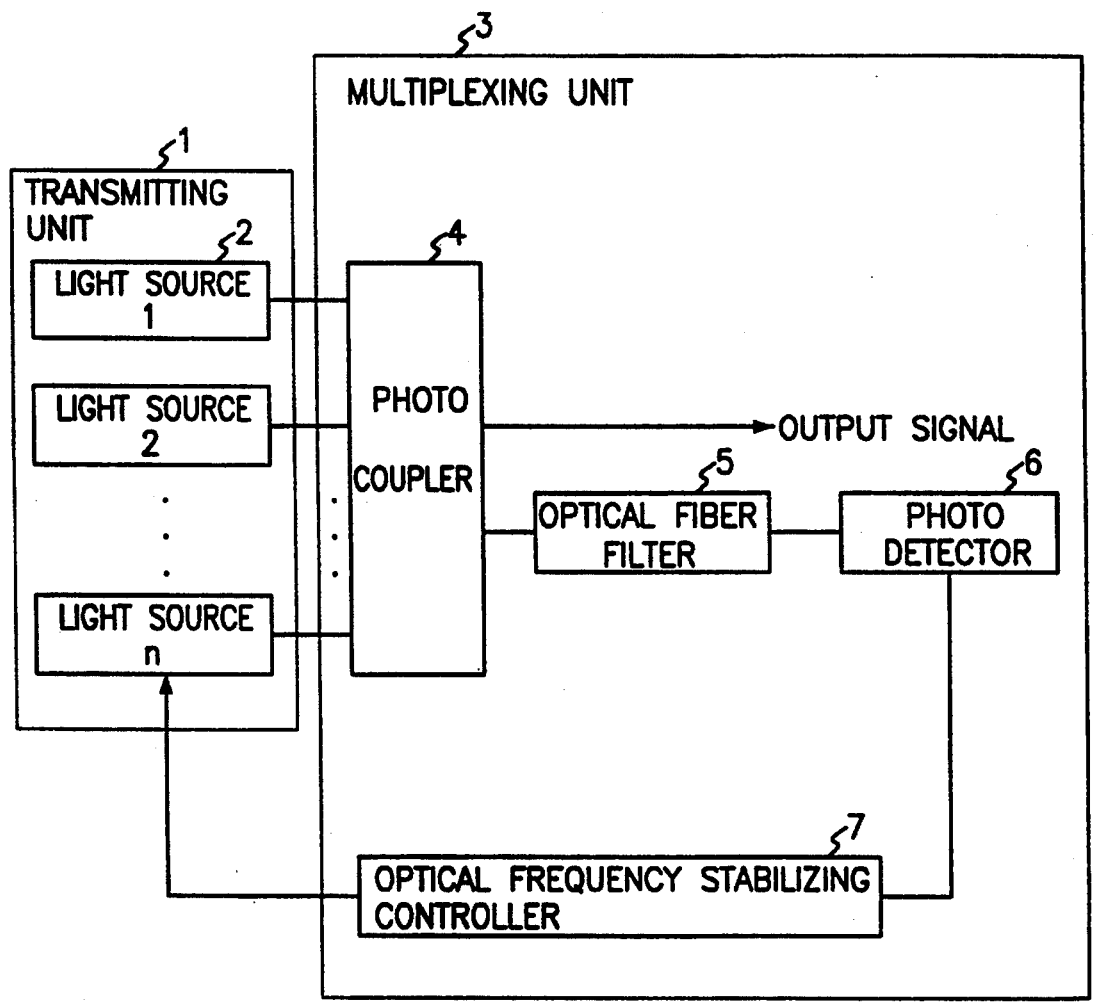
FIG. 1 is a block diagram of a conventional locking apparatus for an optical frequency multiplex system.

Referring to FIG. 2, there is illustrated a locking apparatus for an optical frequency multiplex system in accordance with the present invention. In accordance with the locking apparatus, error signals are extracted using reflection outputs rather than transmitting outputs of an optical fiber filter so as to increase the signal extinction ratio and to maximize the number of multiplex light sources.

As shown in FIG. 2, the locking apparatus includes a local oscillating unit 10 comprised of a plurality of low frequency oscillators 11, and a transmitting unit 12 comprised of a plurality of light sources 13 numbered 1 to n respectively. Low frequency signals outputted from the low frequency oscillators 11 are applied to the light sources 13, respectively. In the light sources 13, center carrier frequencies f1 to fn dither by low frequencies, respectively. As a result, the light sources 13 output dithering optical signals.

The n dithering optical signals respectively outputted from the light sources 13 are coupled by photocoupler means comprised of a 2×2 photocoupler 15 and a 2×1 photocoupler 16. The 2×2 photocoupler 15 serves to couple the optical signals outputted from the light sources 13 and outputs two signals; one being transmitted to an external terminal via an optical fiber as a finally aligned (or multiplexed) output and the other being applied to the 2×1 photocoupler 16 for extraction of error signals required for the alignment.

Figure 3A:
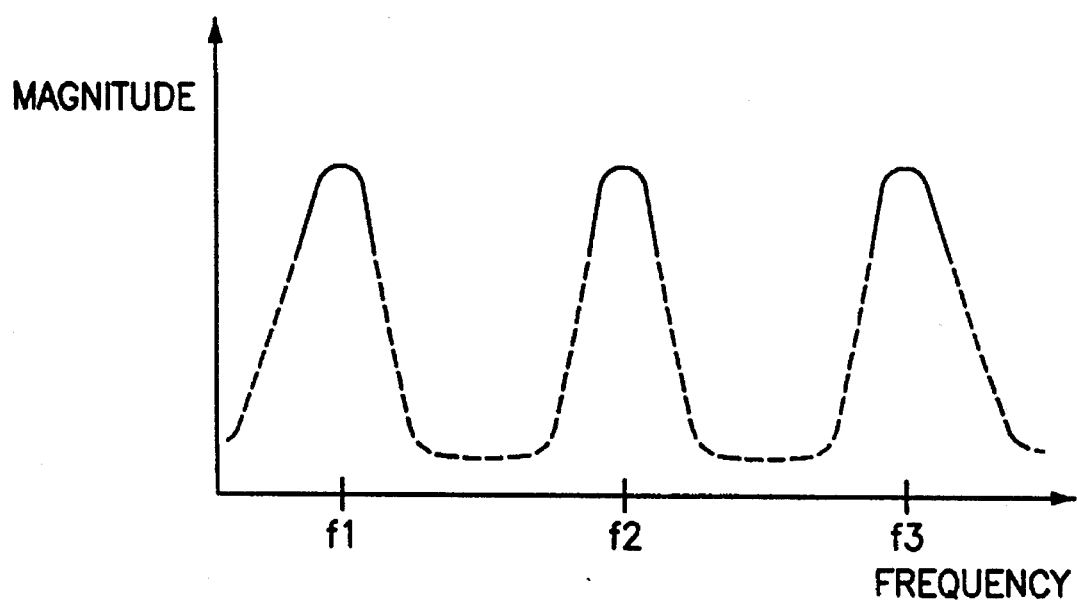
FIGS. 3A and 3B are waveform diagrams respectively illustrating transmission and reflection characteristics of an optical fiber filter constituting a part of the locking apparatus shown in FIG. 2.
Figure 3B:
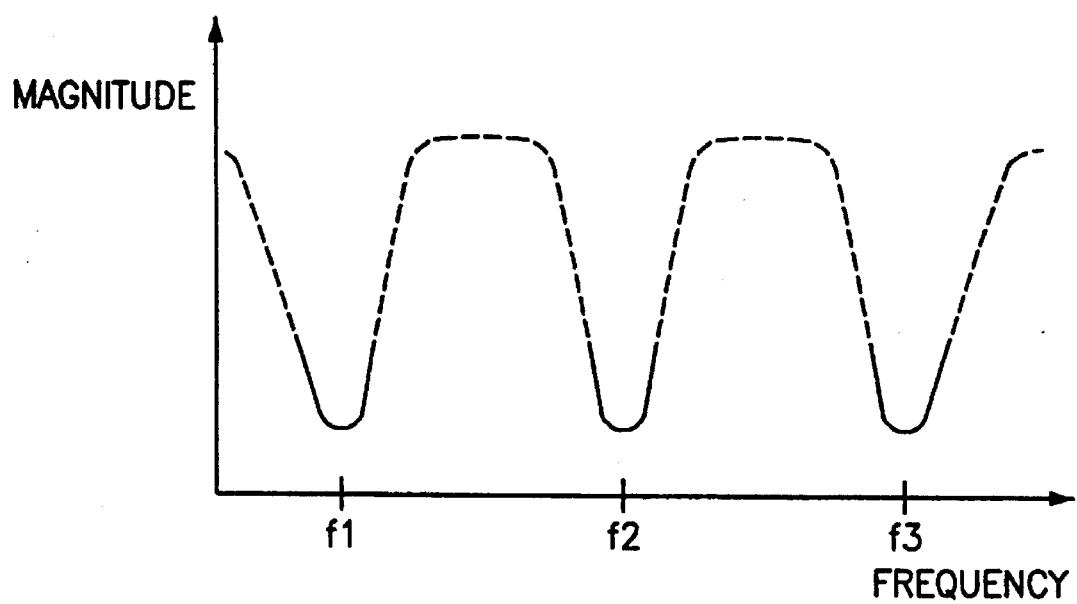

The optical signal applied to the 2×1 photocoupler 16 is then sent to an optical fiber filter 17 constructed in a Fabry-Perot form. By the resonance characteristic of the optical fiber filter 17, a reflection optical signal exhibiting a minimum value at a resonance point, as shown in FIG. 3B, is reversely applied to a photodetector 18 via the 2×1 photocoupler 16.

The reflection optical signal applied to the photodetector 18 is converted into an electrical signal which is, in turn, applied to an optical frequency stabilizing controller 19. The optical frequency stabilizing controller 19 includes a proportional and integral differential (PID) circuit 20 having a phase sensitive detection function, and a phase sensitive detection (PSD) circuit 21 serving to generate a control current on the basis of an error signal detected by the PID circuit 20. The PID circuit 20 detects the degree of the received signal from the resonance point; that is, an error signal corresponding to the value of |fn–fn'|. The error signal is then applied to the PSD circuit 21 which, in turn, converts the received error signal into a corresponding current value. The current value from the PSD circuit 21 is applied to biases of the light sources 13.

As the above-mentioned procedures are repeatedly carried out, the center carrier frequencies f1 to fn of the light sources 13 are aligned to correspond to the resonance frequencies f1' to fn' determined by resonance lengths of the resonator. Accordingly, equidistant optical frequency-multiplexed outputs can be obtained.

Since the 2×1 photocoupler is provided at the front end of the optical fiber filter, it is possible to remove a feedback Fresnel reflection output from unused outputs generated in the case of using the 2×2 photocoupler. thus, a reduction in noise is achieved.

As apparent from the above description, the present invention provides a locking apparatus for an optical frequency multiplex system constructed to apply dithering low frequency signals to individual light sources and extract an error signal by using a reflection output from an optical fiber filter used as a resonator, thereby being capable of obtaining a low output per channel and a high extinction ratio. Accordingly, it is possible to enhance the receiving sensitivity for locking. Therefore, the locking apparatus of the present invention can be used for a high degree of multiplex grouping.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A locking apparatus for an optical frequency multiplex system having a plurality of light sources, comprising:

local oscillating means for applying low frequency signals to individual light sources for making center frequencies of the light sources dither;

photocoupler means for grouping dithering optical signals outputted from the light sources into a single signal;

resonating means for respectively aligning the dithering optical signals coupled by the photocoupler means with optical frequency slots, the resonating means producing a reflection optical signal from an input portion of the resonating means, the reflection optical signal being received by the photocoupler means;

photodetecting means for converting the reflection optical signal applied by the photocoupling means into a photodetector signal; and optical frequency stabilizing control means for controlling the light sources on the basis of the photodetector signal received from the photodetecting means.

2. A locking apparatus in accordance with claim 1, wherein the photocoupler means comprises:

a 2×2 photocoupler for grouping the dithering optical signals respectively outputted from the light sources; and a 2×1 photocoupler coupled to an output of the 2×2 photocoupler, to the input portion of the resonating means and to the photodetecting means.

3. A locking apparatus in accordance with claim 1, wherein the optical frequency stabilizing control means comprises:

a PID circuit for detecting an error signal from the photodetecting signal; and a PSD circuit for generating a control current on the basis of the error signal detected by the PID circuit.

4. A locking apparatus in accordance with claim 1, wherein the resonating means comprises an optical fiber filter.

5. A locking apparatus for an optical frequency multiplex system having a plurality of light sources, comprising:

local oscillating means for generating frequency dithered output signals from each light source;

photocoupler means for grouping the frequency dithered output signals from each light source into a single group signal;

resonating means for comparing the frequency dithered output signals grouped by the photocoupler means with respective optical frequency resonance slots, and for generating a reflection optical signal from an input portion;

applying means for applying the reflection optical signal from the resonating means input portion to a photodetecting means, the photodetecting means generating a photodetector signal in response to the detected reflection optical signal; and optical frequency stabilizing control means for controlling the light sources in response to the photodetector signal.

6. A locking apparatus in accordance with claim 5, wherein the photocoupler means comprises a 2×2 photocoupler and the applying means comprises a 2×1 photocoupler for receiving the single group signal and transmitting the single group signal to the resonating means.

7. A locking apparatus in accordance with claim 5, wherein the optical frequency stabilizing control means comprises:

a PID circuit for detecting an error signal in response to the photodetector signal; and a PSD circuit for generating a control current in response to the error signal, the control current operative to control the light sources.

8. A locking apparatus in accordance with claim 5, wherein the resonating means comprises an optical fiber filter.

* * * * *

UNITED STATES PATENT AND TRADEMARK OFFICE
CERTIFICATE OF CORRECTION

PATENT NO.   : 5,589,970
DATED        : December 31, 1996
INVENTOR(S)  : Gap Y. Lyu, et al.

It is certified that error appears in the above-identified patent and that said Letters Patent is hereby corrected as shown below:

On the title page, item [73], insert "Korea" before "Telecommunication Authority".

Column 1, line 18, "multiplexor" should read --multiplexer--.
Column 1, line 20, insert a --.-- after the word "together".

Column 2, line 30, "accomodate" should read --accommodate.

Column 3, line 21, ";" should read --,--.
Column 3, line 59, "thus" should read --Thus--.

Signed and Sealed this

Eleventh Day of November, 1997

*Attest:*

BRUCE LEHMAN

*Attesting Officer*        Commissioner of Patents and Trademarks